US007300872B2

(12) United States Patent
Park

(10) Patent No.: US 7,300,872 B2
(45) Date of Patent: Nov. 27, 2007

(54) METHOD FOR MANUFACTURING SEMICONDUCTOR DEVICE USING DUAL-DAMASCENE PATTERN

(75) Inventor: Jeong Ho Park, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 25 days.

(21) Appl. No.: 11/019,250

(22) Filed: Dec. 23, 2004

(65) Prior Publication Data

US 2005/0142870 A1  Jun. 30, 2005

(30) Foreign Application Priority Data

Dec. 24, 2003 (KR) .................. 10-2003-0096997

(51) Int. Cl.
*H01L 21/44* (2006.01)
*H01L 21/4763* (2006.01)
(52) U.S. Cl. .................. 438/672; 438/637; 438/642
(58) Field of Classification Search ........... 438/637, 438/638, 639, 642, 672, 643
See application file for complete search history.

(56) References Cited

U.S. PATENT DOCUMENTS 6,326,296 B1   12/2001  Tsai et al.
6,399,478 B2   6/2002   Matsubara et al.
6,898,851 B2 * 5/2005   Nishioka et al. ............. 29/852
2005/0101125 A1 * 5/2005 Smith et al. ................ 438/637

FOREIGN PATENT DOCUMENTS

KR   2001-0027671   4/2001

* cited by examiner

*Primary Examiner*—Chuong Anh Luu
(74) *Attorney, Agent, or Firm*—Lowe Hauptman Ham & Berner LLP

(57) ABSTRACT

A method for manufacturing a semiconductor device using a dual-damascene pattern, where a photosensitive film is coated instead of a dielectric material, the photosensitive film is cured, and the photosensitive film is entirely etched. The method includes forming a first conductor on a first insulation film deposited on a semiconductor substrate, and depositing second, third, and fourth insulation films on the first insulation. The method also includes forming holes by selectively removing the fourth and third films, forming a fifth insulation film where the holes are filled with the fifth film, and forming a sixth insulation film on the fifth and fourth films. The method further includes forming a trench mask pattern on the sixth film, forming trench line holes and trench via holes using the pattern and forming a barrier metal film and a second conductor, where the line and via holes are filled with the second conductor.

20 Claims, 4 Drawing Sheets

METHOD FOR MANUFACTURING SEMICONDUCTOR DEVICE USING DUAL-DAMASCENE PATTERN

BACKGROUND OF THE INVENTION (a) Field of the Invention

The present invention relates to a method for manufacturing a semiconductor device using a dual-damascene pattern.

(b) Description of the Related Art

With the increase in a degree of integration of a semiconductor integrated circuit, the number of interconnections required to connect elements to each other is also being increased. Accordingly, methods employing two or more metal layers are commonly used for manufacturing such integrated circuits. When the degree of integration of an integrated circuit is increased, it is not easy to achieve high production yield and high reliability.

A semiconductor device manufacture method using a damascene process is a manufacture technique including a step of forming interconnection lines by means of a first etching for forming trenches on a flat dielectric film, and filling the trenches with metal. Through this method, a semiconductor substrate can be filled with copper, which is not easily etched. This method using the damascene process is a method employed most commonly in a subquarter micron interconnection manufacture industry.

Recently, with the increase of the degree of integration of the semiconductor device, a multi-metal interconnection structure has been required. The damascene process has been proposed to form multi-metal interconnections efficiently, and particularly, a dual-damascene process is being employed for this process.

This dual-damascene process is used to form bit lines or word lines in addition to metal interconnections. Particularly, for the multi-metal interconnections, this process can form via holes for contacting an upper layer metal interconnection with a lower layer metal interconnection at once. Moreover, this process can remove steps generated when the metal interconnections are formed, thereby facilitating subsequent processes.

The dual-damascene process is generally classified into a via first method and a trench first method. The via first method is a method for first etching an insulation film using a lithography process to form via holes, and then forming trenches on the via holes by etching the insulation films again.

On the contrary, the trench first method is a method for first forming the trenches, and then forming the via holes. Of the two methods, the via first method is more commonly employed.

Furthermore, since a metal film such as aluminum (Al) of the multi-metal interconnections in the manufacture process of the semiconductor device has a very high surface reflectivity, there may arise a problem of notching and thinning of a metal film due to light scattering generated during a lithography process for patterning the metal film.

This problem becomes more serious as the width of the metal interconnection is decreased with the increase of integration of the semiconductor device. In order to avoid this problem, an antireflective coating (ARC) film is formed on the metal film.

On the other hand, with the miniaturization of a design rule below 0.15 μm, it becomes difficult to form via hole patterns and metal interconnection patterns in a backend process of aluminum. Although aluminum has a low specific resistance and a good conductivity, it has a disadvantage in that it has a weak resistance to electron-migration (EM) forming voids due to a mass transport. Accordingly, copper, which has a strong resistance to EM over aluminum, is considered as a next generation interconnection material.

The dual-damascene process is employed to form the metal interconnections of the semiconductor integrated circuit using copper. However, in conventional dual-damascene processes, since a damascene profile has a nearly right angle, it is not easy to remove the ARC film in a subsequent lithography process, thereby difficulty is encountered in manufacture of the semiconductor device.

SUMMARY OF THE INVENTION

To address the above described and other problems, it is an aspect of the present invention to provide a method for manufacturing a semiconductor device using a dual-damascene pattern, which is capable of simplifying a manufacture process of the semiconductor device and reducing time required for the manufacture process by improving a control capability of a dual-damascene process.

Accordingly, there is provided a method for manufacturing a semiconductor device using a dual-damascene pattern. The method includes the steps of forming a first conductor on a portion of a first insulation film deposited on a semiconductor substrate, and depositing a second insulation film, a third insulation film, and a fourth insulation film on the first insulation film on which the first conductor is formed. The method also includes the steps of forming holes by selectively removing the fourth and third insulation films forming a fifth insulation film by coating, hard baking and etching back a photoresist on the fourth insulation film, where the holes are filled with the fifth insulation film, and forming a sixth insulation film on the fifth and fourth insulation films. The method further includes the steps of forming a trench mask pattern on the sixth insulation film, forming a trench line hole and a trench via hole using the trench mask pattern, and forming a barrier metal film and a second conductor, where the trench line hole and the trench via hole are filled with the second conductor.

Preferably, the fifth insulation film is hard baked in a temperature range of 250° C. to 350° C.

Preferably, the second insulation film acts as an etch stop layer when the third and fourth insulation films are etched.

Preferably, the barrier metal film is composed of one selected from the group consisting of i) a multi-layer including Ta, TaN, or a combination of Ta and TaN, ii) a multi-layer including Ti, TiN, or a combination of Ti and TiN, and iii) WNx or a multi-layer including WNx. The second conductor is preferably composed of Cu or a multi-layer including Cu. An antireflective coating (ARC) film is further preferably deposited before the third and fourth insulation films are patterned.

Preferably, the second insulation film and the fourth insulation film are composed of the same material, more preferably, one selected from the group consisting of a nitride film, SiC and an aluminum oxide film.

With the above configuration, a photosensitive film is coated without using a typical dielectric material, the coated photosensitive film is cured by a hard bake process, and the cured photosensitive film is etched using an entire surface etch-back process other than a chemical mechanical polishing process. Accordingly, a semiconductor device using a dual-damascene pattern can be more easily and quickly manufactured.

It is to be understood that both the foregoing general description of the invention and the following detailed description are exemplary, but are not restrictive of the invention.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

A method for manufacturing a semiconductor device using a dual-damascene pattern according to a preferred embodiment of the present invention will now be described in detail with reference to the accompanying drawings.

FIGS. 1A to 1J are diagrams illustrating a method for manufacturing a semiconductor device using a dual-damascene pattern according to an embodiment of the present invention.

Figure 1A:
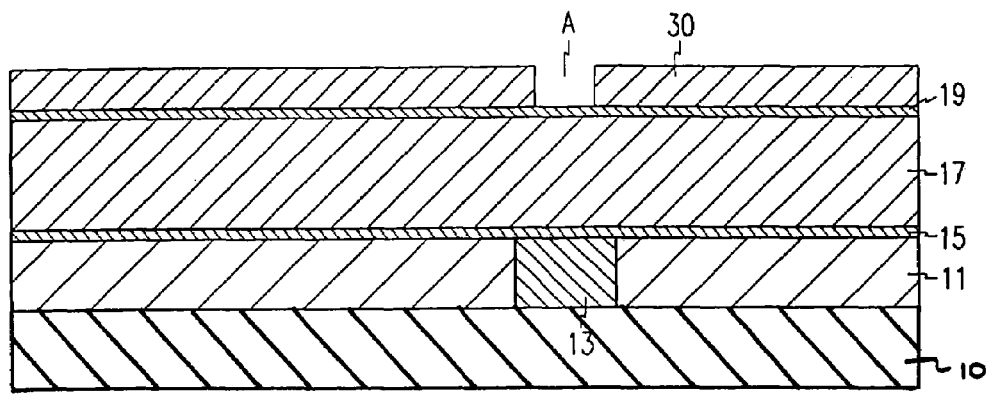
FIGS. 1A to 1J are diagrams illustrating a method for manufacturing a semiconductor device using a dual-damascene pattern according to an embodiment of the present invention.

Referring to FIG. 1A, an insulation material is deposited on a semiconductor substrate 10, and a first insulation film 11 is formed from the insulation material using a mask. A conductive material is then deposited on the first insulation film 11, and a first conductor 13 is formed from the conductive material using a damascene process. A second insulation film 15, a third insulation film 17 and a fourth insulation film 19 are sequentially formed on the first conductor 13, and then, a pattern is formed using a first photosensitive film pattern 30. Here, reference numeral A denotes a window for formation of a via hole.

The second insulation film 15 and the fourth insulation film 19 are composed of the same insulation material, for example, a nitride film. Alternatively, the second insulation film 15 and the fourth insulation film 19 can be composed of SiC or an aluminum oxide film.

Figure 1B:
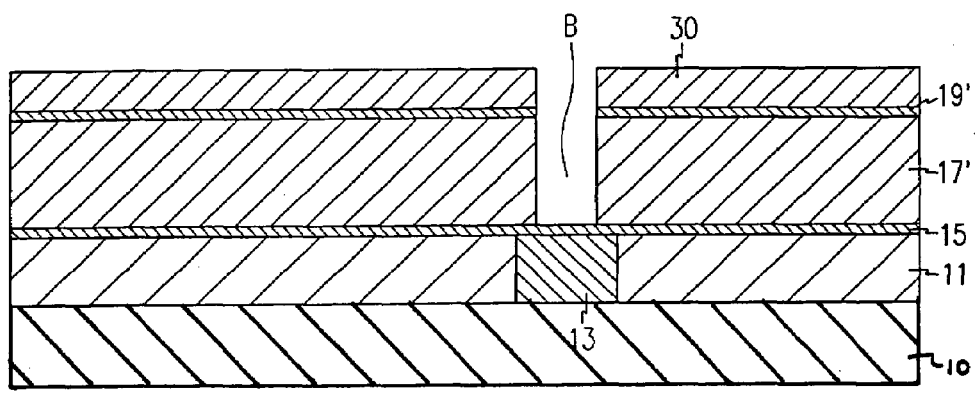

Next, as shown in FIG. 1B, a hole B is formed by removing a portion of the fourth insulation film and a portion of the third insulation film 17 by performing a dry etch using the first photosensitive pattern 30. In FIG. 1B, the fourth insulation film and the third insulation film with hole B after performing the dry etch are denoted by reference numerals 19' and 17', respectively.

Figure 1C:
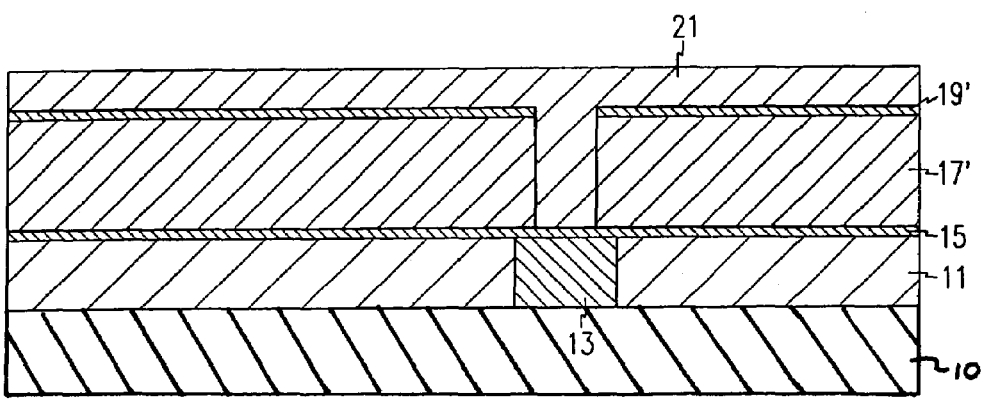

Subsequently, as shown in FIG. 1C, the first photosensitive pattern 30 is removed, and a fifth insulation film 21 is coated and then is hard baked at a high temperature. At this time, the fifth insulation film 21 is formed by coating a photoresist and is cured by hard baking. Here, the temperature of hard baking has preferably a range of 250° C. to 350° C.

Figure 1D:
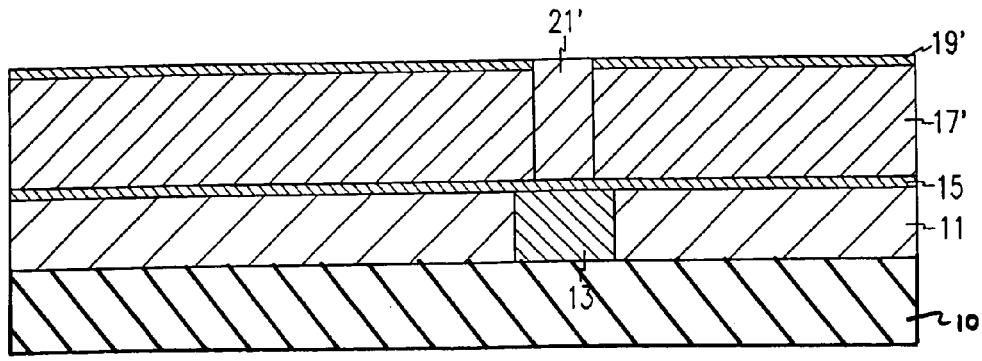

Next, as shown in FIG. 1D, the fifth insulation film 21 is etched back using a dry etch to form a hole fill portion 21' filled with the fifth insulation film 21.

Figure 1E:
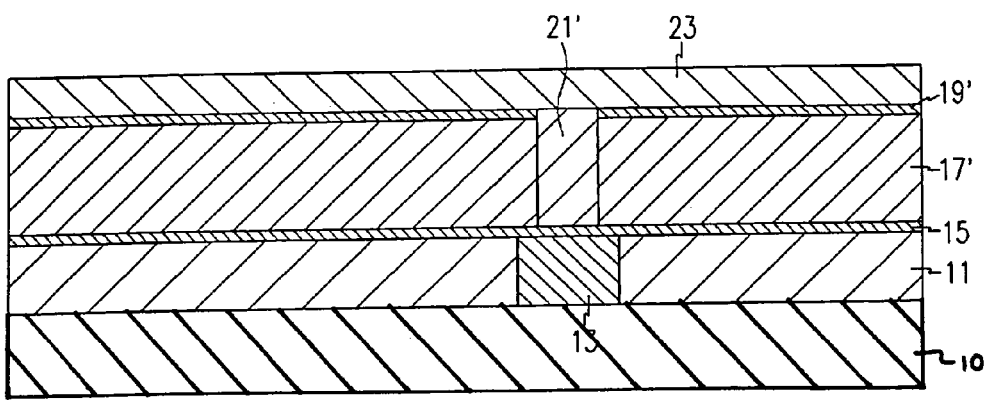

Next, as shown in FIG. 1E, an insulation material is deposited to form a sixth insulation film 23.

Figure 1F:
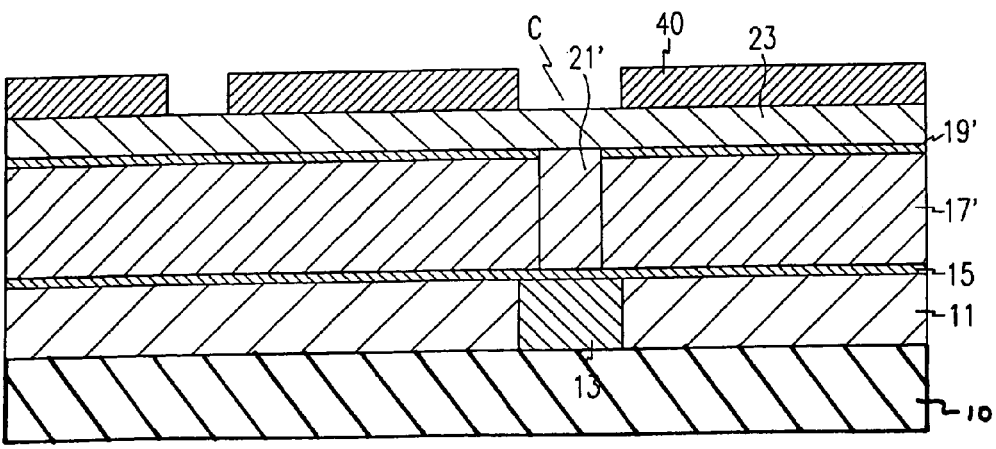

Next, as shown in FIG. 1F, a trench mask pattern 40 is formed on the sixth insulation film 23. Here, reference numeral C denotes a window for trench formation.

Figure 1G:
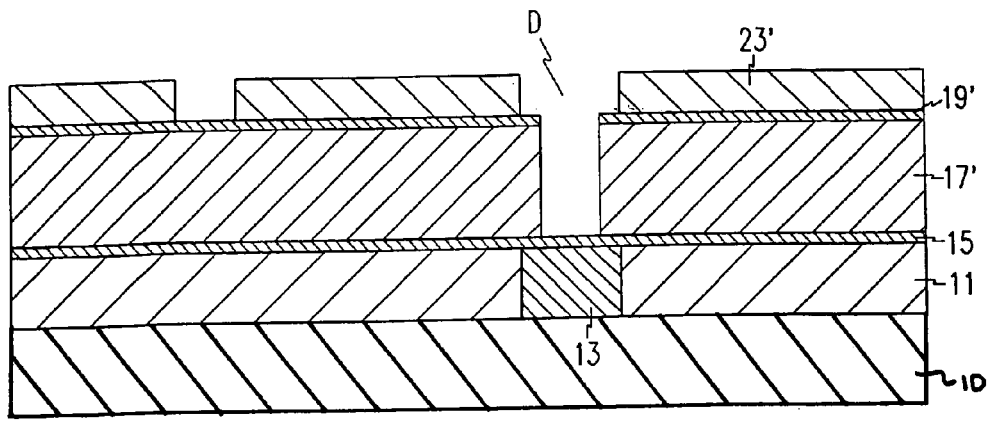

Next, as shown in FIG. 1G, the sixth insulation film 23 is selectively removed to form a trench D by performing a dry etch using the trench mask pattern 40. In FIG. 1G, the sixth insulation film with trench D after performing the dry etch is denoted by reference numeral 23'.

Subsequently, the trench mask pattern 40 is removed. At this time, the hole fill portion 21' is removed together with the trench mask pattern after forming the sixth insulation film 23'.

Figure 1H:
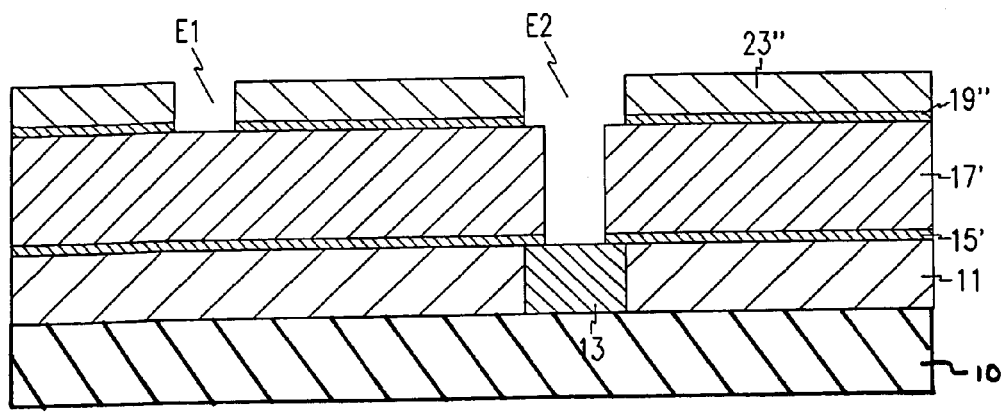

Next, as shown in FIG. 1H, the surfaces of the sixth insulation film 23', the fourth insulation film 19' and the second insulation film 15 are entirely etched. In FIG. 1H, the sixth insulation film, the fourth insulation film and the second insulation film after performing the entire surface etch are denoted by reference numerals 23", 19" and 15', respectively. Here, the second insulation layer acts as an etch stop layer when the third and fourth insulation films are etched.

Figure 2:
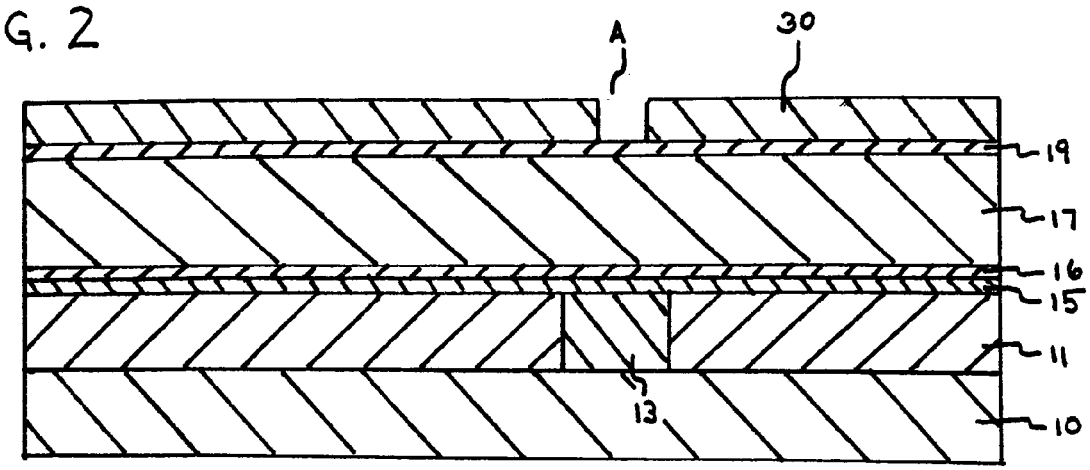
FIG. 2 is a diagram illustrating a step of a method for manufacturing a semiconductor device using a dual-damascene pattern according to an alternative embodiment of the present invention.

In addition, an antireflective coating (ARC) film 16 depicted in FIG. 2 may be further deposited before the third and fourth insulation films 17' and 19" are patterned. For example, an ARC film 16 can be formed on the second insulation film 15, for use during etching of the damascene via hole E2, as depicted in FIG. 2, which is depicted at the same stage in the process as FIG. 1A.

Here, reference numeral E1 denotes a damascene line hole in which a damascene line is formed, and reference numeral E2 denotes a damascene via hole in which a damascene via is formed.

Figure 1I:
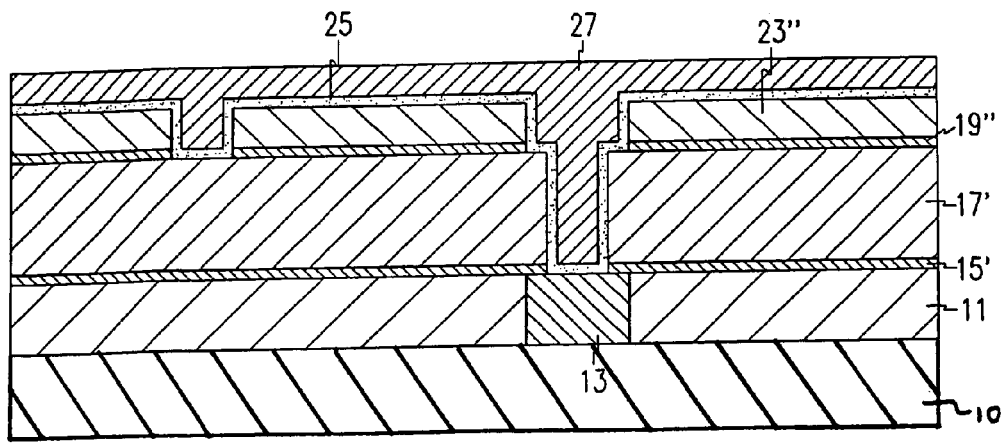

Next, as shown in FIG. 1I, a barrier metal film 25 and a second conductor 27 are sequentially deposited on the structure shown in FIG. 1H. Here, the barrier metal film 25 may be composed of one selected from the group consisting of i) a multi-layer including Ta, TaN, or a combination of Ta and TaN, ii) a multi-layer including Ti, TiN, or a combination of Ti and TiN, and iii) WNx or a multi-layer including WNx. In addition, the second conductor is preferably composed of Cu or a multi-layer including Cu.

Figure 1J:
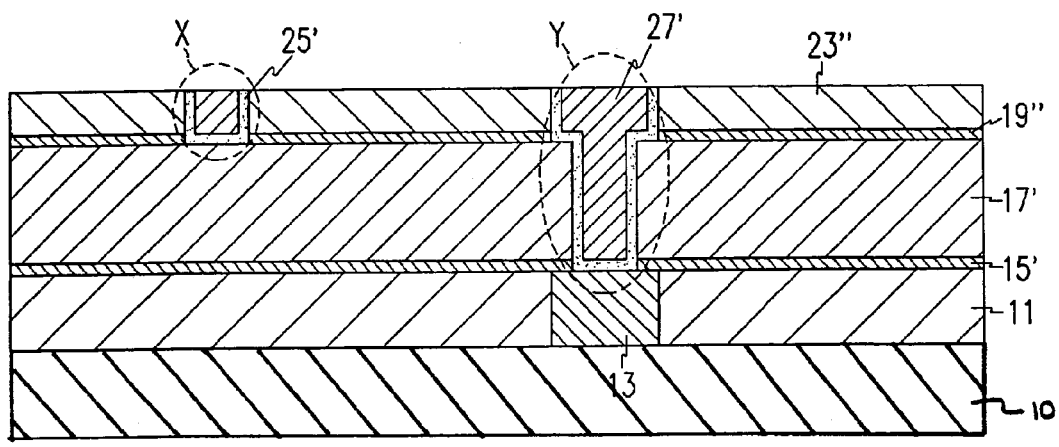

Next, as shown in FIG. 1J, the barrier metal film 25 and the second conductor 27 are planarized, using a chemical mechanical polishing (CMP) process, such that they have the same height as that of the sixth insulation film 23", to form a planarized barrier metal film 25' and a second planarized conductor 27'. Here, reference numeral X denotes the damascene line and reference numeral Y denotes the damascene via.

As described above, the present invention provides a method for manufacturing a semiconductor device using a dual-damascene pattern, wherein a photosensitive film is coated instead of a typical dielectric material, the coated photosensitive film is cured by a hard bake process, and the cured photosensitive film is etched using a entire surface etch-back process other than a chemical mechanical polishing process.

As is apparent from the above description, according to the present invention, a dual-damascene manufacture process can be simplified, process time required can be reduced, and a process control capability can be improved.

In addition, according to the present invention, an antireflective coating (ARC) film employed in a lithography process can be removed in the dual damascene process.

Although the preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

This application incorporates by reference in its entirety an application for A METHOD FOR MANUFACTURING A SEMICONDUCTOR DEVICE USING DUAL-DAMASCENE PATTERN filed in the Korean Industrial Property Office on Dec. 24, 2003 and there duly assigned Ser. No. 10-2003-0096997.

What is claimed is:

1. A method for manufacturing a semiconductor device using a dual-damascene pattern, the method comprising the steps of:
    forming a first conductor on a portion of a first insulation film deposited on a semiconductor substrate;
    depositing a second insulation film, a third insulation film, and a fourth insulation film on the first insulation film;
    forming a first hole by selectively removing portions of the fourth and third insulation films;
    forming a fifth insulation film by coating a photoresist on the fourth insulation film, the first hole being filled with the fifth insulation film;
    curing the fifth insulation film by hard baking;
    etching back the fifth insulation film using a dry etch to form a hole fill potion filled with the fifth insulation film;
    forming a sixth insulation film on the fifth and fourth insulation films;
    forming a trench mask pattern on the sixth insulation film;
    forming a trench line hole and a trench via hole using the trench mask pattern; and
    forming a barrier metal film and a second conductor, the trench line hole and the trench via hole being filled with the second conductor.

2. The method of claim 1, wherein the step of forming a fifth insulation film includes hard baking the fifth insulation film in a temperature range of 250° C. to 350° C.

3. The method of claim 1, further comprising using the second insulation film as an etch stop layer when the third and fourth insulation films are etched to form the first hole.

4. The method of claim 1, wherein the step of forming a barrier metal film includes forming the barrier metal film from a material selected from the group consisting of i) a multi-layer including Ta, TaN, or a combination of Ta and TaN, ii) a multi-layer including Ti, TiN, or a combination of Ti and TiN, and iii) WNx or a multi-layer including WNx.

5. The method of claim 1, wherein the step of forming a barrier metal film includes forming the second conductor from one of Cu and a multi-layer including Cu.

6. The method of claim 1, further comprising the step of: depositing an antireflective coating film before the third and fourth insulation films are deposited.

7. The method of claim 1, wherein the depositing step includes using a same material for the second insulation film and the fourth insulation film.

8. The method of claim 7, wherein the depositing step includes forming the second insulation film and the fourth insulation film from at least one of a nitride film, SiC and an aluminum oxide film.

9. A method for manufacturing a semiconductor device, the method comprising the steps of:
    forming a first conductor in a first insulation film deposited on a semiconductor substrate;
    depositing a second insulation film on the first conductor and the first insulation film;
    depositing a third insulation film on the second insulation film;
    depositing a fourth insulation film on the third insulation film;
    forming a first hole by selectively removing portions of the fourth and third insulation films;
    forming a fifth insulation film by coating a photo resist on the fourth insulation film, where the first hole is filled with the fifth insulation film;
    curing the fifth insulation film by hard baking;
    etching back the fifth insulation film using a dry etch to form a hole fill potion filled with the fifth insulation film;
    forming a sixth insulation film on the fifth and fourth insulation films;
    forming a trench line hole through the sixth insulation film, and a trench via hole through the sixth film, the fifth insulation film, and the second insulation film to the first conductor; and
    forming a barrier metal film and a second conductor, where the trench line hole and the trench via hole are filled with the second conductor.

10. The method of claim 9, wherein the step of forming a fifth insulation film includes hard baking the fifth insulation film in a temperature range of 250° C. to 350° C.

11. The method of claim 9, further comprising using the second insulation film as an etch stop layer when the third and fourth insulation films are etched to form the first hole.

12. The method of claim 9, wherein the step of forming a barrier metal film includes forming the barrier metal film from a material selected from the group consisting of i) a multi-layer including Ta, TaN, or a combination of Ta and TaN, ii) a multi-layer including Ti, TiN, or a combination of Ti and TiN, and iii) WNx or a multi-layer including WNx.

13. The method of claim 9, wherein the step of forming a barrier metal film includes forming the second conductor from one of Cu and a multi-layer including Cu.

14. The method of claim 9, further comprising the step of: depositing an antireflective coating film before the third and fourth insulation films are deposited.

15. The method of claim 9, wherein the depositing step includes using a same material for the second insulation film and the fourth insulation film.

16. The method of claim 15, wherein the depositing step includes forming the second insulation film and the fourth insulation film from at least one of a nitride film, SiC and an aluminum oxide film.

17. A method for manufacturing a semiconductor device, the method comprising the steps of:
    forming a first conductor in a first insulation film deposited on a semiconductor substrate;
    depositing a second insulation film on the first insulation film;
    forming a third insulation film and a fourth insulation film on the second insulation film, where a first hole is formed through the fourth and third insulation films;
    forming a fifth insulation film by coating a photo resist on the fourth insulation film, where the first hole is filled with the fifth insulation film;
    curing the fifth insulation film by hard baking;
    etching back the fifth insulation film using a dry etch to form a hole fill potion filled with the fifth insulation film;
    forming a sixth insulation film on the fourth and fifth insulation films;

forming a trench line hole in the sixth insulation film, and a trench via hole extending through the sixth, fifth, and second insulation films to the first conductor; and filling the trench line hole and the trench via hole with a barrier metal film and a second conductor.

18. The method of claim 17, further comprising using the second insulation film as an etch stop layer when the third and fourth insulation films are etched to form the first hole.

19. The method of claim 17, further comprising the step of: depositing an antireflective coating film before the third and fourth insulation films are deposited.

20. The method of claim 17, wherein the depositing step includes using a same material for the second insulation film and the fourth insulation film.

\* \* \* \* \*